(12) United States Patent
Lin (10) Patent No.: US 8,497,061 B2
(45) Date of Patent: Jul. 30, 2013

(54) METHOD FOR REPLICATING PRODUCTION OF 3D PARALLAX BARRIER

(75) Inventor: Ming-Yen Lin, Taipei (TW)

(73) Assignee: Unique Instruments Co. Ltd, Taipei (TW)

( * ) Notice: Subject to any disclaimer, the term of this patent is extended or adjusted under 35 U.S.C. 154(b) by 383 days.

(21) Appl. No.: 12/896,398

(22) Filed: Oct. 1, 2010

(65) Prior Publication Data

US 2011/0080566 A1    Apr. 7, 2011

(30) Foreign Application Priority Data

Oct. 2, 2009    (TW) ................................ 98133590 A (51) Int. Cl.
*G03F 7/20* (2006.01)

(52) U.S. Cl.
USPC ............................................ 430/321; 430/325

(58) Field of Classification Search
None
See application file for complete search history.

(56) References Cited

U.S. PATENT DOCUMENTS

2009/0147178 A1* 6/2009 Ahn et al. .................... 349/62

* cited by examiner

*Primary Examiner* — John A. McPherson
(74) *Attorney, Agent, or Firm* — WPAT, PC; Justin King (57) ABSTRACT

A method for replicating production of a 3D parallax barrier is capable of transfer-printing a 3D parallax barrier pattern on a planar transparent substrate mainly with a glass photo mask having the 3D parallax barrier pattern through processes of photo resistor coating, exposure, and development by using a photolithography technology, thereby achieving the purpose of replicating production.

5 Claims, 9 Drawing Sheets

METHOD FOR REPLICATING PRODUCTION OF 3D PARALLAX BARRIER

BACKGROUND OF THE INVENTION

1. Field of Invention

The present invention relates to a method of massive production for replicating a 3D parallax barrier, capable of printing a 3D parallax barrier pattern on a planar transparent substrate mainly with a glass photo mask having the 3D parallax barrier pattern through processes of photo resistor coating, exposure, and development by using a photolithography technology, thereby achieving the purpose of replicating production.

2. Related Art

Figure 1:
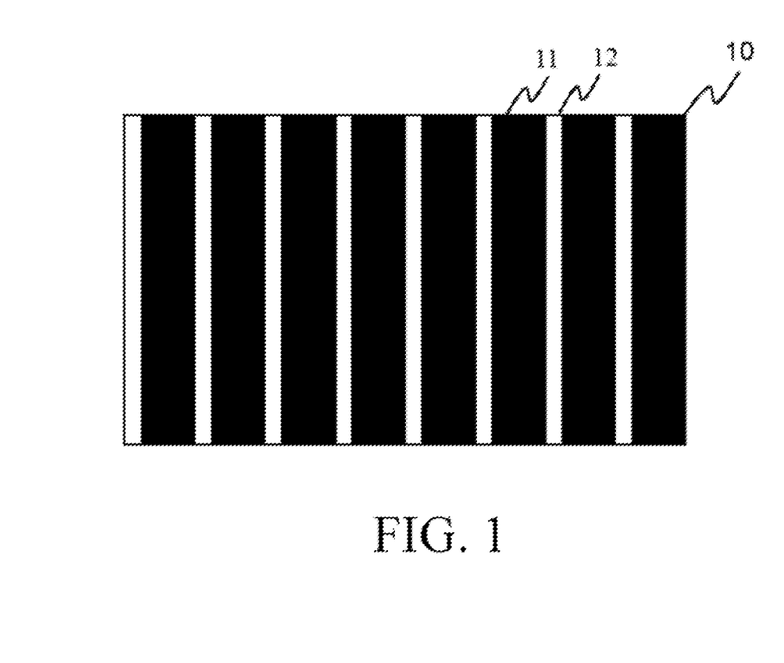
FIG. 1 is a schematic view of a conventional vertical strip parallax barrier.
Figure 2:
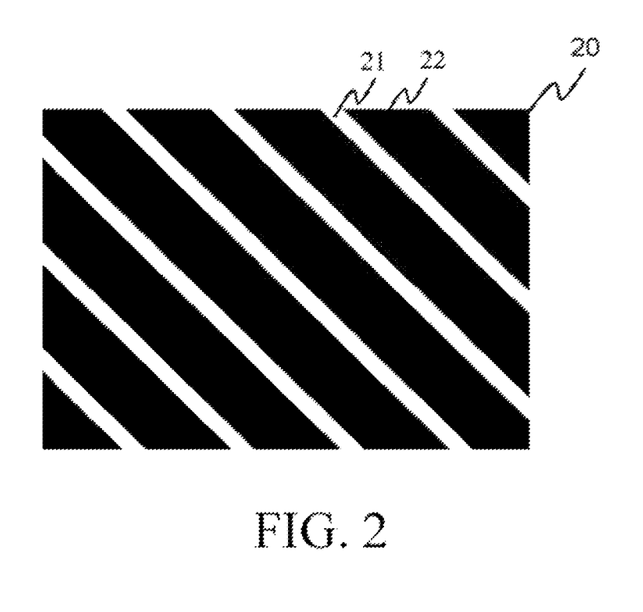
FIG. 2 is a schematic view of a conventional slantwise strip parallax barrier.
Figure 3:
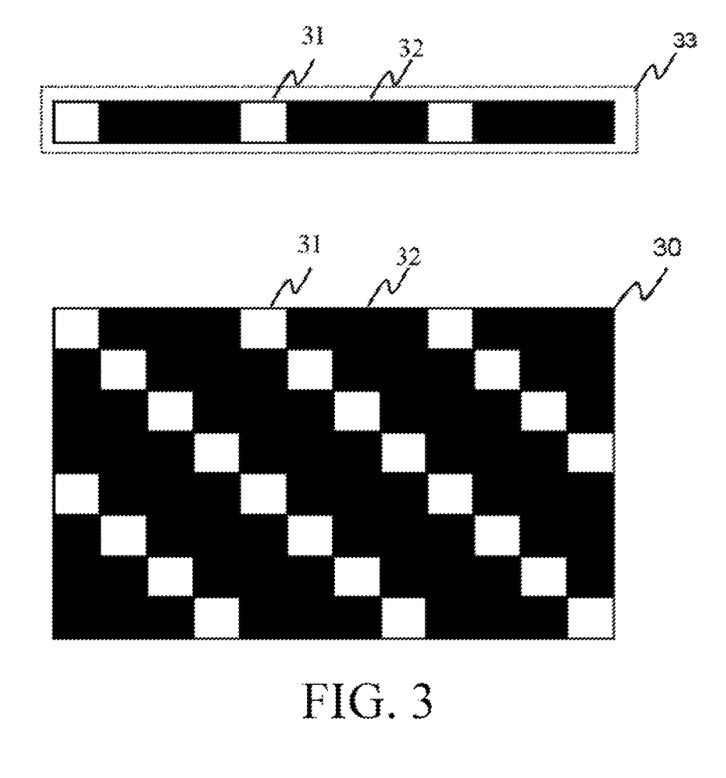
FIG. 3 is a schematic view of a conventional slant and step parallax barrier.

FIGS. 1 to 3 are schematic views of a structure of a conventional parallax barrier optical pattern. The structure of the parallax barrier optical pattern is mainly divided into three types, that is, a vertical strip parallax barrier 10, a slantwise strip parallax barrier 20, and an slant and step parallax barrier 30. All the three types of the parallax barriers 10, 20, and 30 have a basic optical structure.

As shown in FIG. 1, the basic optical pattern of the vertical strip parallax barrier 10 is formed by a vertical strip light transmitting element 11 and a vertical strip light shielding element 12. The light transmitting element 11 and the light shielding element 12 are alternately arranged in a repetitive manner in a horizontal direction to form the vertical strip parallax barrier 10.

As shown in FIG. 2, the basic optical pattern of the slantwise strip parallax barrier 20 is formed by a slantwise strip light transmitting element 21 and an slantwise strip light shielding element 22. The light transmitting element 21 and the light shielding element 22 are alternately arranged in a repetitive manner in a horizontal direction to form the slantwise strip parallax barrier 20.

As shown in FIG. 3, the basic optical pattern of the slant and step parallax barrier 30 is formed by a grid light transmitting element 31 and another grid light shielding element 32. The light transmitting element 31 and the light shielding element 32 are alternately arranged in a repetitive manner in a horizontal direction to form a horizontal structure 33. The horizontal structure 33 is arranged with an increasing displacement in a repetitive manner in a vertical direction to form the slant and step parallax barrier 30.

Figure 4:
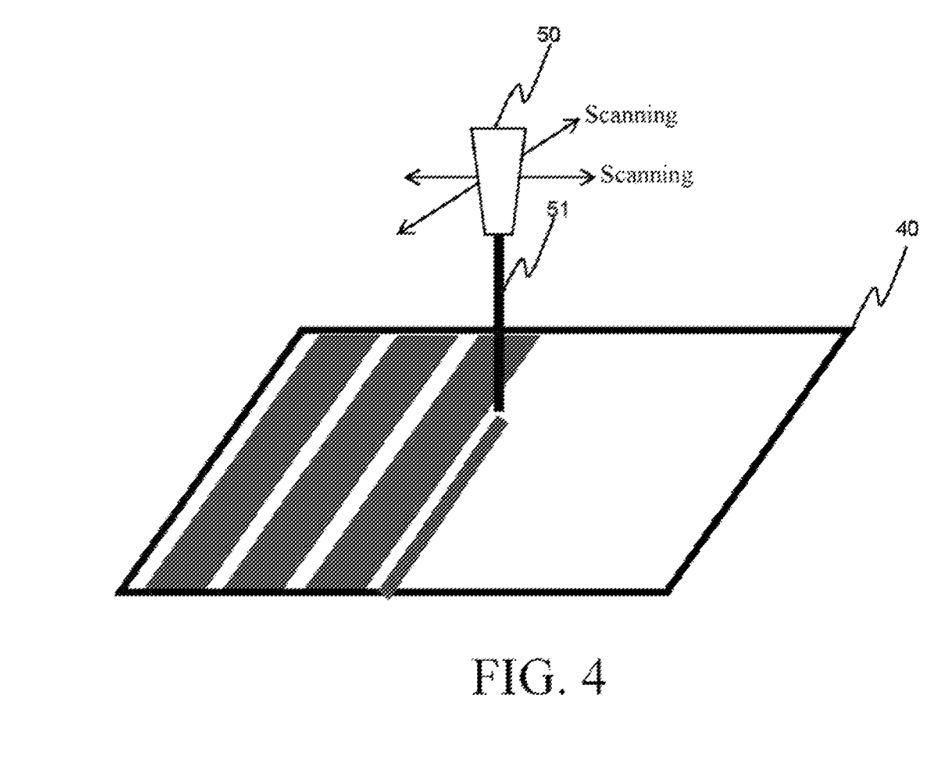
FIG. 4 is a schematic view of a conventional glass photo mask process.
Figure 5:
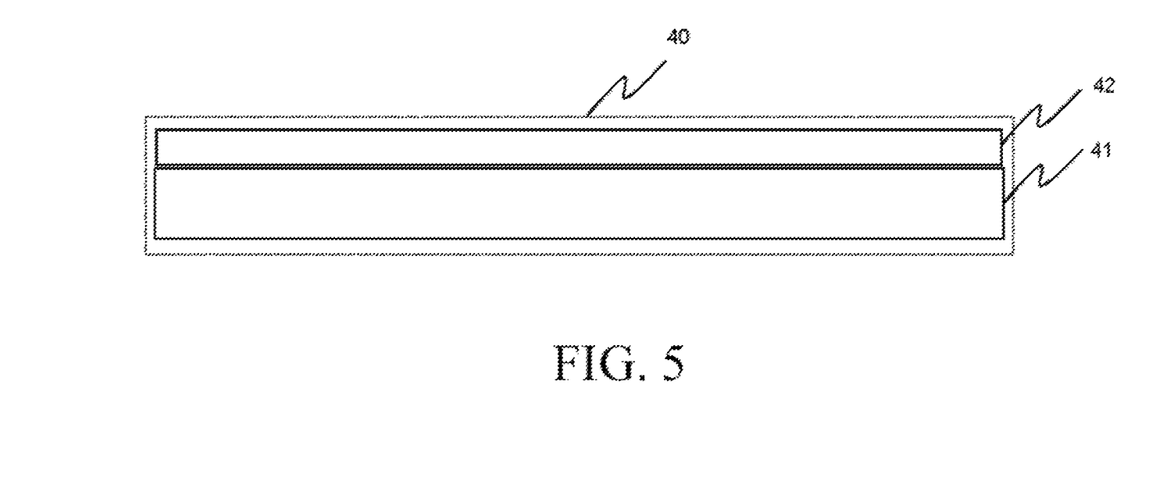
FIG. 5 is a schematic view of a structure of a conventional glass negative.

For the fabrication of the parallax barrier optical pattern, usually the parallax barrier optical pattern is plotted on a transparent substrate through a photo mask process. FIG. 4 is a schematic view of a photo mask process. In the photo mask process, a designed parallax barrier optical pattern is plotted mainly with a scanning laser beam 51 on a glass negative 40 by using a laser plotter 50 having a high positioning accuracy. As shown in FIG. 5, the glass negative 40 is mainly formed by a transparent substrate (for example, glass or quartz) 41 having a high flatness and a photo-sensitive agent 42. The photo-sensitive agent 42 is attached to the transparent substrate 41. After being exposed and plotted by the laser plotter 50, the photo-sensitive agent 42 is then developed, hard-baked, and treated by other processes to form the parallax barrier optical pattern on the transparent substrate 41. Although the parallax barrier may be fabricated through the photo mask process, the fabrication cost is high, and the purpose of mass production with economic benefit cannot be achieved.

SUMMARY OF THE INVENTION

To reduce the cost of the expensive photo mask process in the prior art, the present invention is directed to a method of massive production for replicating a 3D parallax barrier, capable of printing a parallax barrier pattern on a planar transparent substrate of a low unit price mainly with a glass photo mask having the parallax barrier pattern through photo resistor coating, exposure, development, and other photolithography processes, thereby achieving the purpose of replicating production.

DETAILED DESCRIPTION OF THE INVENTION

Figure 6:
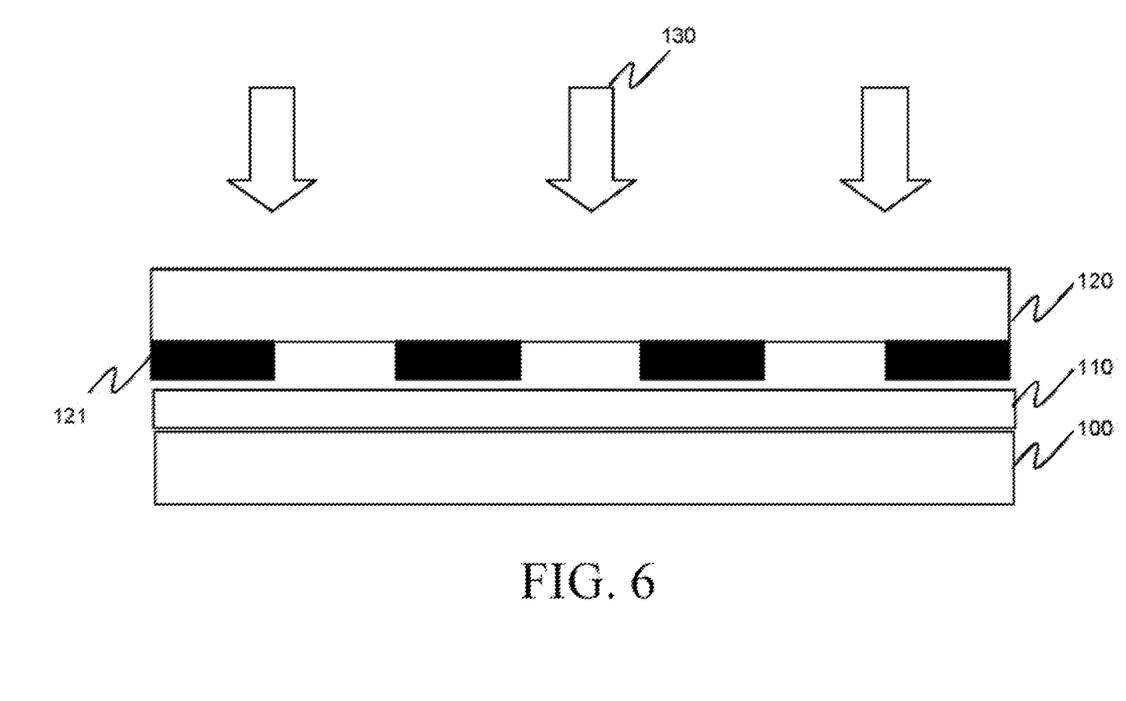
FIG. 6 is a schematic view of replicating a parallax barrier by using a photolithography technology with a parallel light source according to the present invention.
Figure 7:
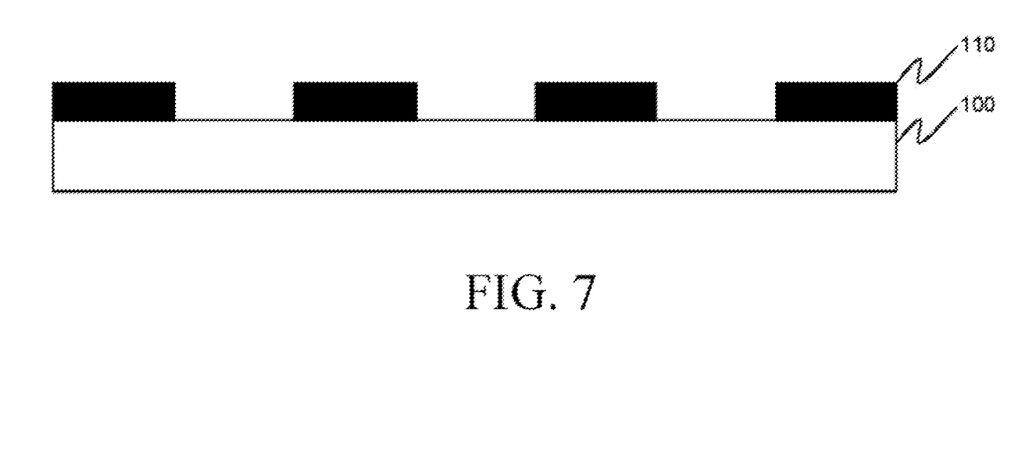
FIG. 7 is a schematic view of replicating a parallax barrier.

FIG. 6 is a schematic view of fabricating a parallax barrier optical pattern by using photolithography processes. A planar glass (for example, glass used by a liquid crystal panel) 100 of a low unit price is mainly used, and a layer of a photo resistor 110 having an appropriate thickness is coated on the planar glass. Definitely, the use of positive and negative photo resistors is a conventional common sense, and will not be described herein again. Afterwards, a glass photo mask 120 having a parallax barrier optical pattern 121 is installed and positioned on the photo resistor 110, and exposure, development, hard baking (not shown), and other processes are performed by using an appropriate parallel light source 130, as shown in FIG. 7, such that the pattern 121 is replicated on the planar glass.

Due to the large size of the parallax barrier, in terms of the mass replicating efficiency, as shown in FIG. 6, when the exposure process is performed by using the parallel light source 130, the brightness of the irradiation light on a unit area is insufficient, and the exposure time is prolonged, resulting in an increase of the mass production cost. Definitely, the brightness of the irradiation light on the unit area of the parallel light source 130 may be largely raised to shorten the exposure time, but the power consumption is also increased. Therefore, the present invention provides a method to solve the problems of the light source and realize the cost benefit of mass production.

Figure 8:
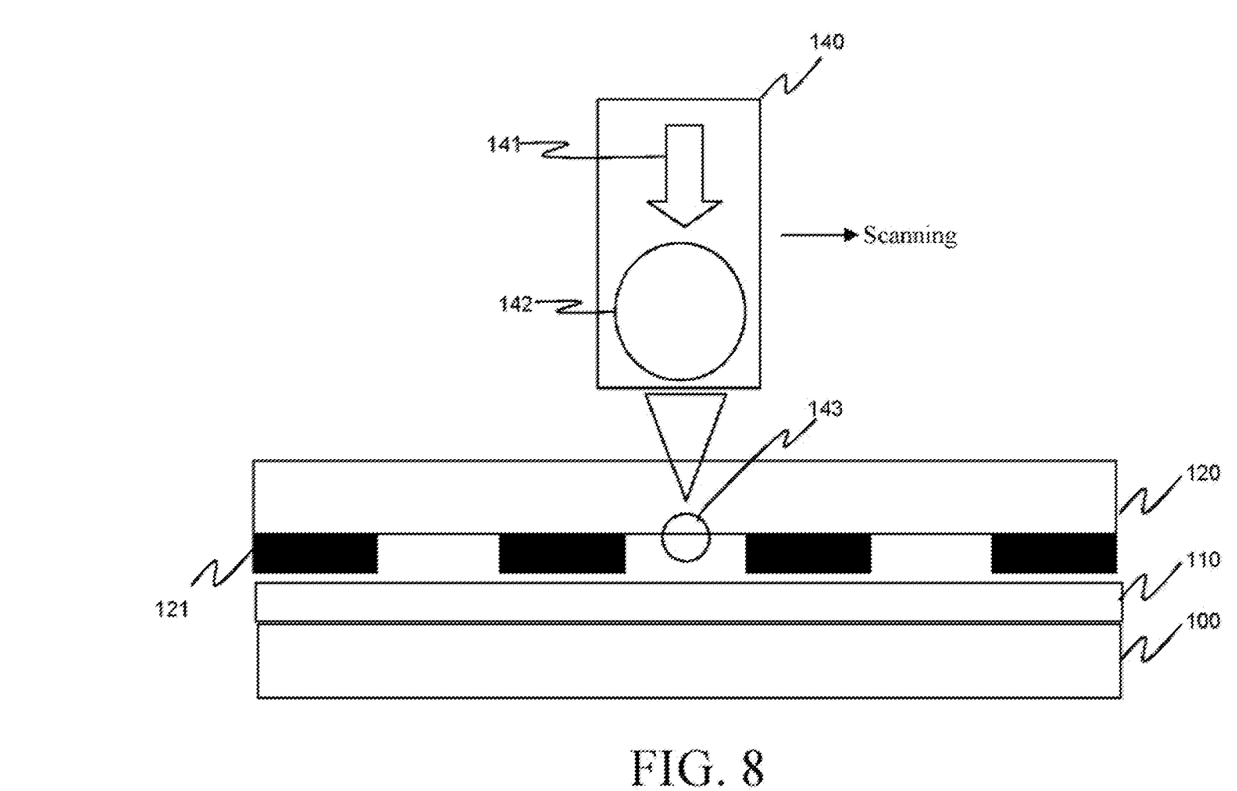
FIG. 8 is a schematic view of replicating a parallax barrier by using a photolithography technology with a scanning line focusing light source according to the present invention.

FIG. 8 is a schematic view of a scanning line focused light source device. The scanning line focused light source device 140 is mainly formed by a light source 141 and an optical system 142. The optical system 142 may focus the light source 141 on a surface of the photo resistor 110, and scanning exposure can be implemented through the movement of the scanning line focused light source device 140.

Figure 9:
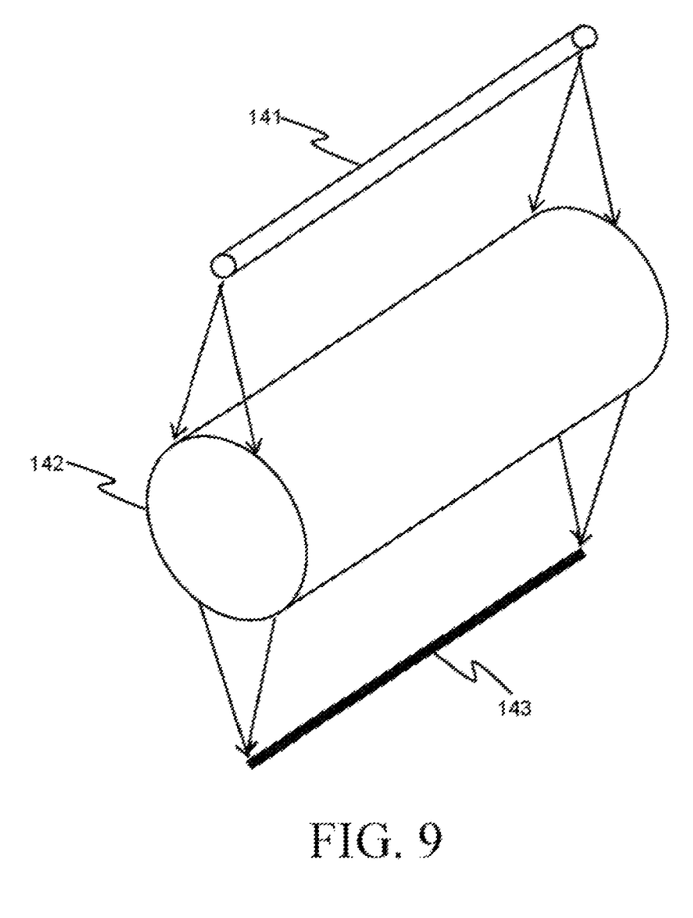
FIG. 9 is a schematic view of generation of a line focusing light source according to the present invention.

As shown in FIG. 9, the optical system 142 may be formed by a cylindrical or a semi-cylindrical (not shown) optical lens, and has one-dimensional focusing optical features. The light source 141 may be a strip light source, or formed by a plurality of point light sources (not shown) appropriately arranged on a straight line. Therefore, the optical system 142 may focus the light source 141 into a strip light source 143 with an appropriate width.

Therefore, by using the scanning line focusing light source device 140, quick exposure is achieved and the power consumption is also reduced.

What is claimed is:

1. A method of massive production for replicating a 3D parallax barrier, comprising:
    providing a glass photo mask having a parallax barrier pattern;
    providing a planar glass; and
    printing a parallax barrier pattern on said planar glass with said glass photo mask, comprising
        conducting an appropriate thickness a photo resistor coating on said planar glass by using a photolithography technology;
        installing said glass photo mask having said parallax barrier pattern on said photo resistor; and
        replicating said parallax barrier pattern on said planar glass by using said photolithography technology, comprising:
            conducting exposure by using a line focused light source;
            conducting development; and
            conducting hard baking.

2. The method of massive production for replicating the 3D parallax barrier according to claim 1, wherein the glass photo mask having the parallax barrier pattern is formed by the parallax barrier pattern and a planar transparent substrate, and capable of printing the parallax barrier pattern on the planar glass through a glass photo mask process.

3. The method of massive production for replicating the 3D parallax barrier according to claim 2, wherein the parallax barrier pattern is a vertical strip parallax barrier pattern, a slantwise strip parallax barrier pattern, or an slant and step parallax barrier pattern.

4. The method of massive production for replicating the 3D parallax barrier according to claim 1, wherein the line focused light source is generated by a strip light source or a plurality of point light sources appropriately arranged on a straight line, with a cylindrical or a semi-cylindrical one-dimensional focusing optical lens.

5. The method of massive production for replicating the 3D parallax barrier according to claim 1, wherein the line focused light source performs scanning along a straight line.

* * * * *